United States Patent
Eom et al.

(10) Patent No.: US 8,179,172 B2
(45) Date of Patent: May 15, 2012

(54) AUTO-RESTART CIRCUIT AND AUTO-RESTART METHOD

(75) Inventors: Hyun-Chul Eom, Seoul (KR); Jin-Tae Kim, Seoul (KR); Gwan-Bon Koo, Gyeonggi-do (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 135 days.

(21) Appl. No.: 12/716,983

(22) Filed: Mar. 3, 2010

(65) Prior Publication Data
US 2011/0156770 A1  Jun. 30, 2011

(30) Foreign Application Priority Data
Dec. 31, 2009  (KR) .................. 10-2009-0136121

(51) Int. Cl.
*H03L 7/00* (2006.01)
(52) U.S. Cl. .................. 327/143; 323/284; 323/285
(58) Field of Classification Search .................. 327/143; 323/284, 285
See application file for complete search history.

(56) References Cited

U.S. PATENT DOCUMENTS

| | | | | |
|---|---|---|---|---|
| 7,821,236 B2* | 10/2010 | Hasegawa et al. | ............ | 323/222 |
| 7,859,235 B2* | 12/2010 | Yamashita | ............ | 323/274 |
| 7,863,875 B1* | 1/2011 | Guo et al. | ............ | 323/275 |
| 7,880,456 B2* | 2/2011 | Falvey et al. | ............ | 323/284 |
| 8,013,585 B2* | 9/2011 | Yamada | ............ | 323/285 |
| 2006/0119340 A1* | 6/2006 | Tateishi | ............ | 323/284 |

FOREIGN PATENT DOCUMENTS

| | | |
|---|---|---|
| JP | 2001-309655 | 11/2001 |
| JP | 2004-320912 | 11/2004 |
| JP | 2004-342324 | 12/2004 |
| JP | 2008-099439 | 4/2008 |
| KR | 10-2008-0084054 | 9/2008 |

* cited by examiner

*Primary Examiner* — Kenneth B. Wells
(74) *Attorney, Agent, or Firm* — Okamoto & Benedicto LLP

(57) ABSTRACT

Disclosed is an auto-restart circuit and auto-restart method. A main integrated circuit (IC) of a main stage controls a switching operation of at least one power switch. The auto-restart circuit for restarting the main IC detects a switching state of the at least one power switch and detects the state of the main IC. The auto-restart circuit cuts off an external power source voltage supply to the main IC or supplies the external power source voltage to the main IC according to switching state and the state of the main IC.

20 Claims, 12 Drawing Sheets

US 8,179,172 B2

AUTO-RESTART CIRCUIT AND AUTO-RESTART METHOD

CROSS-REFERENCE TO RELATED APPLICATION

This application claims priority to and the benefit of Korean Patent Application No. 10-2009-0136121 filed in the Korean Intellectual Property Office on Dec. 31, 2009, the entire contents of which are incorporated herein by reference.

BACKGROUND OF THE INVENTION (a) Field of the Invention

The present invention relates to an auto-restart circuit and auto-restart method, and more particularly, to an auto-restart circuit of a main stage that receives a power source voltage from an external source, and a method thereof.

(b) Description of the Related Art

FIG. 1 illustrates a power source device including a standby power stage 10 and a main stage 20.

A device such as a TV and the like, of which operation can be controlled by using a remote controller, includes the standby power stage 10 and the main stage 20.

The standby power stage 10 includes a standby integrated circuit (IC) 11, a primary coil (or a primary winding) 12, a standby power switch 13, a secondary coil (or a secondary winding) 14, a diode 15, an output capacitor 16, an auxiliary coil 17, a diode 18, and an auxiliary capacitor 19.

The standby IC 11 controls a switching operation of the standby power switch 13 connected to the primary coil 12. The primary coil 12, the secondary coil 14, and the auxiliary coil 17 are coupled at a certain winding ratio.

The diode 15 rectifies current flowing across the secondary coil 14, and the capacitor 16 is charged with the rectified current. The voltage charged in the capacitor 16 is a standby voltage Vo2.

The diode 18 rectifies current flowing across the auxiliary coil 17, and the capacitor 19 is charged with the rectified current. The voltage charged in the capacitor 19 is supplied as a power source voltage Vcc to a main IC 21 of the main stage 20 as well as to the standby IC 11.

A switch 30 is turned on according to a turn-on command received from a remote controller. When the switch 30 is turned on, the power source voltage Vcc is supplied to the main IC 21.

The main stage 20 includes the main IC 21, an upper switch 22, a lower switch 23, a resonance capacitor 24, a primary coil 25, a secondary coil 26, rectifying diodes 27 and 28, and an output capacitor 29.

As the upper and lower switches 22 and 23 are alternately turned on and off, an AC voltage is applied to the primary coil 25. Resonance is generated with resonance capacitor, leakage inductance and magnetizing inductance components of a transformer formed by the primary coil 25 and the secondary Coil 26, which causes current to be generated across the primary coil 25 and the secondary coil 26.

The rectifying diodes 27 and 28 rectify the current flowing across the secondary coil 26, and the output capacitor 29 is charged with the rectified current to generate a main output voltage Vo1.

A capacitor 31 smoothes an input voltage Vin. The standby power stage 10 and the main stage 20 receive the input voltage Vin from the capacitor 31.

If an abnormal state, such as an overload state, an over-voltage state of the output voltage Vo1, an over-voltage state of the input voltage Vin, an excessive temperature increase at the power source device, and an overcurrent flowing at the upper and lower switches 22 and 23 occurs, the main IC 21 is turned off and the upper and lower switches 22 and 23 do not perform a switching operation according to a protection operation for protecting the main stage 20. This is called a protection state. When the abnormal state is resolved, the protection state is finished and the main IC 21 restarts its operation.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an auto-restart circuit and auto-restart method having advantages of automatically restarting a main integrated circuit (IC).

An exemplary embodiment of the present invention provides an auto-restart circuit for restarting at least one power switch and a main IC that controls a switching operation of the at least one power switch, including: a switching state detection unit configured to detect a switching state of the at least one power switch; and a state detection unit configured to detect a state of the main IC, wherein an external power source voltage supply to the main IC is cut off or the external power source voltage is supplied to the main IC according to the switching state and the state of the main IC. When the at least one power switch is in a no-switching state and the main IC is in an ON state, the external power source voltage is cut off. When the at least one power switch is in a switching state or when the main IC is in an OFF state, the external power source voltage is supplied.

The auto-restart circuit may further include: a supply switch configured to transfer the external power source voltage to the main IC; and a restart controller configured to control switching of the supply switch, wherein the switching state detection unit generates a switching detection voltage according to a gate signal for controlling switching of the at least one power switch, and the state detection unit for detecting the state of the main IC is a feedback signal generating unit that generates a feedback voltage by a feedback current generated when the main IC is in the ON state.

The restart controller may include: a first control switch having one end connected with a gate electrode of the supply switch; a second control switch having one end connected with the other end of the first control switch and the other end grounded; and a resistor having one end connected with the one end of the first control switch and the other end to which the external power supply voltage is applied, wherein the first control switch performs a switching operation according to the feedback voltage and the second control switch performs a switching operation according to the switching detection voltage. The feedback voltage is generated when the main IC is in the ON state, and is not generated when the main IC is in the OFF state.

The feedback signal generating unit may include: an opto-diode configured to generate light with strength corresponding to an output voltage generated according to the switching operation of the power switch; an opto-transistor configured to form an opto-coupler with the opto-diode; and a feedback capacitor having one end connected with one end of the opto-transistor and the other end which is grounded, wherein the feedback current is supplied to the opto-transistor and the feedback capacitor, and a gate electrode of the first switch is connected with the one end of the feedback capacitor.

The switching state detection unit may include: a diode having an anode electrode to which the gate signal is inputted; a first resistor having one end connected with a cathode electrode of the diode and the other end which is grounded; a capacitor having one end connected with the one end of the first resistor and the other end which is grounded; a switch having a gate electrode connected with the one end of the capacitor and a first electrode which is grounded; and a second resistor having one end connected with a second electrode of the switch and the other end to which the external power source voltage is supplied, wherein the voltage of the one end of the second resistor is a switching detection signal.

The auto-restart circuit may further include: a threshold voltage compensation unit configured to compensate for the level of the feedback voltage and transfer the level-compensated feedback voltage to the gate electrode of the first control switch so that the first control switch can be turned on when the feedback voltage is higher than a certain burst stop voltage.

The threshold voltage compensation unit may include: a first resistor having one end connected with the gate electrode of the first control switch and the other end which is grounded; and a second resistor having one end connected with the one end of the first resistor and the other end to which the feedback voltage is inputted.

When there is an initial delay time between a turn-on time point of the main IC and a switching time point of the at least one power switch, the threshold voltage compensation unit may compensate for the feedback voltage such that the feedback voltage has such a level so as to turn on the first control switch after the initial delay time, and transfer the compensated feedback voltage to the gate electrode of the first control switch.

The threshold voltage compensation unit may include: a first resistor having one end connected with the gate electrode of the first control switch and the other end which is grounded; a second resistor having one end connected with the one end of the first resistor and the other end to which the feedback voltage is inputted; and a capacitor connected in parallel with the first resistor.

The auto-restart circuit may include: a supply switch configured to transfer the external power source voltage to the main IC; and a restart controller configured to control switching of the supply switch, wherein the switching state detection unit includes an auxiliary coil coupled at a certain winding ratio to a primary coil that generates a voltage according to switching of the at least one power switch and generates the switching detection voltage by using an auxiliary voltage of the auxiliary coil, and the state detection unit for detecting the state of the main IC uses a reference voltage generated when the main IC is in the ON state.

The re-start controller may include: a first control switch having one end connected with the gate electrode of the supply switch; a second control switch having one end connected with the other end of the first control switch and the other end grounded; and a resistor having one end connected with the one end of the first control switch and the other end to which the external power source voltage is applied, wherein the first control switch performs a switching operation according to the reference voltage and the second control switch performs a switching operation according to the switching detection voltage.

The switching state detection unit may include: a diode having a cathode electrode connected with one end of the auxiliary coil having the other end grounded; a capacitor having one end connected with an anode electrode of the diode and the other end which is grounded; a first resistor having one end connected with the one end of the capacitor and the other end connected with a control electrode of the second control switch; and a second resistor having one end connected with the control electrode of the second control switch and the other end to which the external power source voltage is applied.

The auto-restart circuit may further include: a threshold voltage compensation unit configured to compensate for the reference voltage such that the reference voltage has such a level so as to turn on the first control switch after an initial delay time and transfer the compensated reference voltage to the gate electrode of the first control switch, when the initial delay time comes between a turn-on time point of the main IC and a switching time point of the at least one power switch. The threshold voltage compensation unit may include: a resistor having one end to which the reference voltage is applied and the other end connected with the gate electrode of the first control switch; and a capacitor having one end connected with the gate electrode of the first control switch and the other end which is grounded.

Another embodiment of the present invention provides an auto-restart method for restarting at least one power switch and a main IC that controls a switching operation of the at least one power switch, including: detecting a switching state of the at least one power switch; detecting a state of the main IC; and cutting off an external power source voltage supply to the main IC or supplying the external power source voltage to the main IC according to the switching state and the state of the main IC.

The cutting off or supplying the external power source voltage to the main IC may include, when the at least one power switch is in a no-switching state and the main IC is in an ON state, cutting off the external power source voltage.

The cutting off or supplying the external power source voltage to the main IC may include, when the at least one power switch is in a switching state or when the main IC is in an OFF state, supplying the external power source voltage.

An exemplary embodiment of the present invention provides the auto-restart circuit and auto-restart method that are capable of restarting the main IC automatically.

DETAILED DESCRIPTION OF THE EMBODIMENTS

Figure 1:
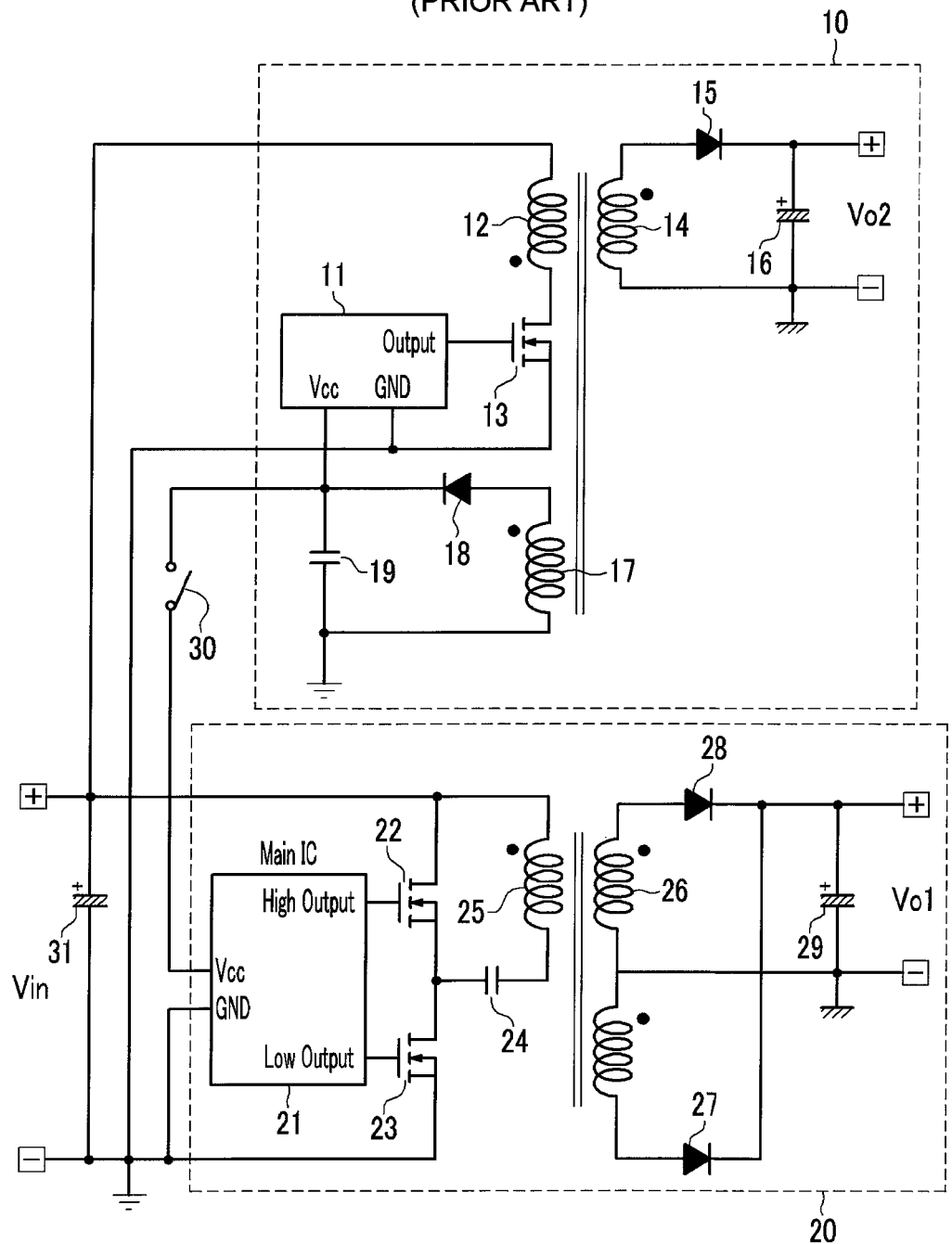
FIG. 1 is a drawing illustrating a power source device including a standby power stage and a main stage.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

A first exemplary embodiment of the present invention that may be easily implemented by the skilled person in the art to which the present invention pertains will now be described in detail with reference to the accompanying drawings.

Figure 2:
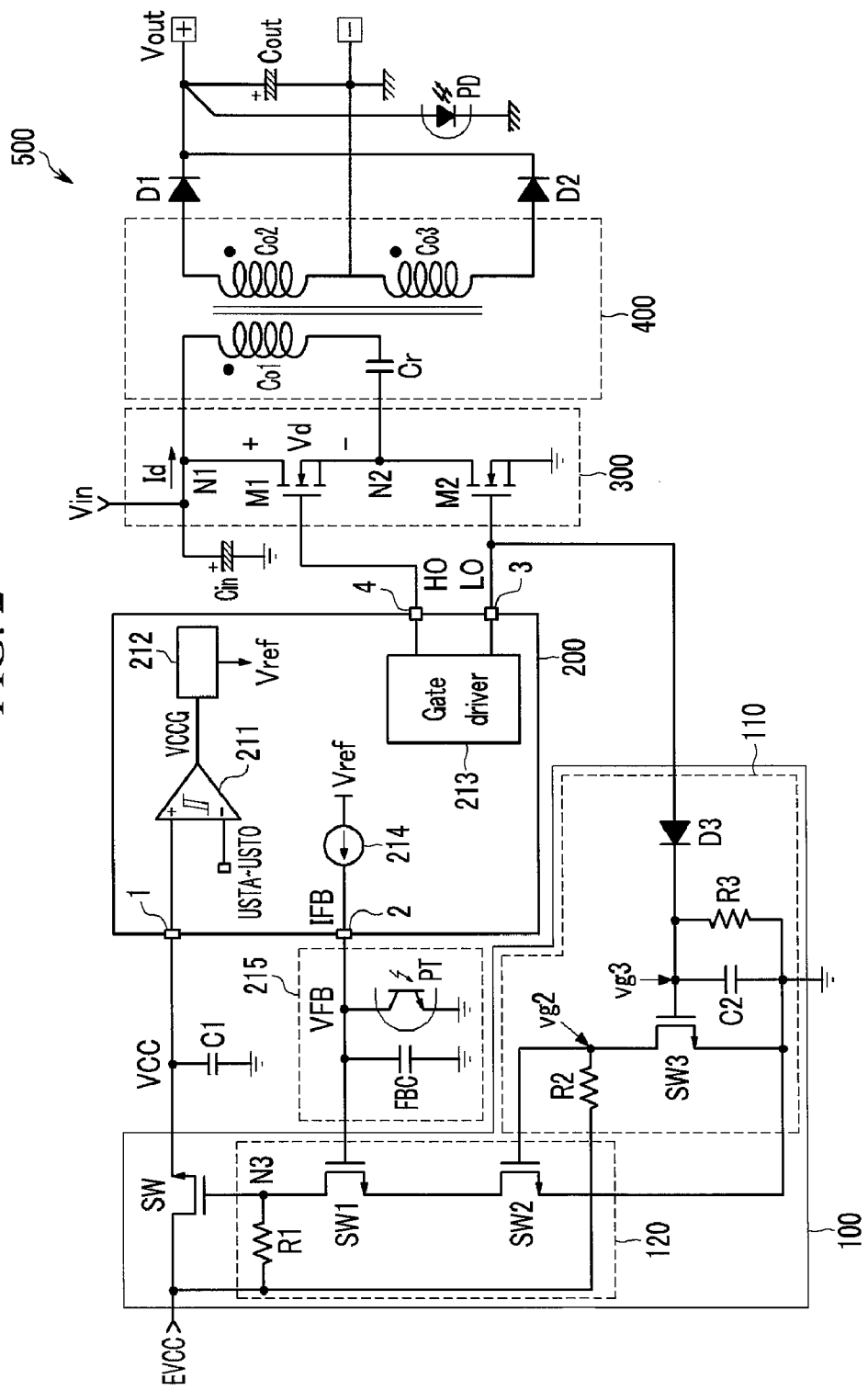
FIG. 2 is a drawing illustrating a main stage 500 including an auto-restart circuit 100 according to a first exemplary embodiment of the present invention.

FIG. 2 is a drawing illustrating a main stage 500 including an auto-restart circuit 100 according to a first exemplary embodiment of the present invention. The main stage 500 receives a power source voltage required for its operation from an external source. The main stage 500 may receive a power source voltage from the standby power stage 10 as shown in FIG. 1

Hereinafter, the power source voltage inputted from the external source will be referred to as an "external power source voltage (EVCC)". The power source voltage inputted through a connection terminal 1 connected with a main integrated circuit (IC) 200 will be referred to as "VCC".

The main stage 500 includes the auto-restart circuit 100, the main IC 200, a square wave generating unit 300, and a resonant network unit 400. Rectifying diodes D1 and D2 rectify current flowing across secondary coils Co2 and Co3 of the resonant network unit 400. An output capacitor Cout is charged with the rectified current, and the voltage of the output capacitor Cout is an output voltage Vout of the main stage 500. An input voltage Vin is transferred to one end of a capacitor Cin, and the capacitor Cin smoothes the input voltage Vin.

The square wave generating unit 300 includes an upper switch M1 and a lower switch M2. The square wave generating unit 300 generates the input DC voltage Vin as a square wave according to switching operations of the upper switch M1 and the lower switch M2. In detail, the upper switch M1 and the lower switch M2 are alternately turned on and off. Then, a driving voltage Vd between nodes N1 and N2 has a square wave having a peak value with the same level as the voltage Vin and the lowest value of 0V. The upper switch M1 is controlled by a gate signal HO transferred from the main IC 200, and the lower switch M2 is controlled by a gate signal LO transferred from the main IC 200. The upper switch M1 and the lower switch M2 according to the first exemplary embodiment of the present invention are implemented as n channel type metal oxide semiconductor field-effect transistors (MOSFET).

The resonant network unit 400 includes a primary coil Co1, secondary coil Co2, a tertiary coil Co3, and a capacitor Cr. Resonance occurs between leakage inductance and magnetizing inductance components of a transformer formed by the primary coil and the secondary coil, and the resonance capacitor Cr. A resonant current Id inputted to the resonant network unit 400 according to the resonance has a sign wave. Both end voltages of the primary coil Co1 are transferred to the secondary coil Co2 according to a winding ratio of the primary coil Co1 and the secondary coil Co2 (namely, the ratio between the winding number of the secondary coil Co2 and that of the primary coil Co1), and transferred to the tertiary coil Co3 according to a winding ratio of the primary coil Co1 and the tertiary coil Co3 (namely, the ratio between the winding number of the tertiary coil Co3 and that of the primary coil Co1). The current flowing across the primary coil Co1 is transferred to the secondary coil Co2 in a state of being inversely proportional to the winding ratio of the primary coil Co1 and the secondary coil Co2, and is transferred to the tertiary coil Co3 in a state of being inversely proportional to the winding ratio of the primary coil Co1 and the tertiary coil Co3. The resonant current Id is the sum of current generated as the current flowing across the secondary coils Co2 and Co3 affects the primary coil Co1 and the magnetizing component current generated by the magnetizing inductance.

The main IC 200 includes a UVLO comparator 211, a reference voltage generator 212, and a gate driver 213.

The UVLO comparator 211 compares the power source voltage VCC inputted through the connection terminal 1, a start voltage USTA, and a stop voltage USTO, and starts to operate the main IC 200 or stops the operation of the main IC 200 according to the comparison results. A capacitor C1 is connected to the connection terminal 1. The capacitor C1 smoothes the external power source voltage EVCC transferred via the supply switch SW to generate the power source voltage VCC.

In detail, the UVLO comparator 211 is implemented as a hysterisis comparator. When the power source voltage VCC increases, the UVLO comparator 211 generates a high level low voltage protection signal VCCG triggering the operation of the main IC 200 at a time point when the power source voltage VCC reaches the start voltage USTA. When the power source voltage VCC decreases, the UVLO comparator 211 generates a low level low voltage protection signal VCCG pausing the operation of the main IC 200 at a time point when the power source voltage VCC lowers to reach the stop voltage USTO.

The low voltage protection signal VCCG operates the reference voltage generator 212, and the reference voltage generator 212 generates a reference voltage required for the operation of the main IC 200 by using the power source voltage VCC.

The gate driver 213 controls the switching operation of the upper switch M1 and the lower switch M2 serving to control the operation of the main stage 500. The main stage 500 may be a resonant converter as illustrated in FIG. 2, or may be any other type of converter. The gate driver 213 is designed according to the type of the converter constituting the main stage 500.

For example, if the main stage 500 is the resonant converter as illustrated in FIG. 2, the gate driver 213 generates two gate signals HO and LO for controlling the switching operation of the upper and lower switches M1 and M2, which are power switches. The gate driver 213 transfers the generated gate signals HO and LO to the upper and lower switches M1 and M2 via connection terminals 4 and 3, respectively.

A feedback current source 214 supplies a feedback current IFB to a feedback voltage generator 215 via a connection terminal 2 by using the reference voltage Vref.

The feedback voltage generator 215 generates a feedback voltage VFB corresponding to the output voltage Vout by using the feedback current IFB. The feedback voltage generator 215 includes a feedback capacitor FBC, and an opto-transistor PT and an opto-diode PD constituting an opto-coupler. The opto-diode PD emits light according to the output voltage, and current corresponding to the emitted light flows across the opto-transistor PT. When the output voltage Vout increases, the current flowing at the opto-transistor PT increases and the feedback capacitor FBC is discharged to reduce the feedback voltage VFB. Conversely, when the output voltage Vout decreases, the current flowing at the opto-transistor PT is reduced and the feedback capacitor FBC is charged to increase the feedback voltage VFB.

The main IC 200 controls the switching operation of the upper and lower switches M1 and M2 according to the feedback voltage VFB to uniformly maintain the output voltage Vout. Namely, when the feedback voltage VFB increases, the main IC 200 controls the switching operation of the upper and lower switches M1 and M2 toward increasing the output voltage. When the feedback voltage VFB decreases, the main IC 200 controls the switching operation of the upper and lower switches M1 and M2 toward decreasing the output voltage.

When the main IC 200 is turned on to operate, the feedback voltage VFB is uniformly maintained. In the first exemplary embodiment of the present invention, the state of the main IC 200, that is, whether the main IC 200 is in an ON or OFF state, is detected by using the feedback voltage VFB.

The auto-restart circuit 100 detects the switching state of the power switch and the state of the main IC 200 that controls the power switch, and controls the ON/OFF operation of the main IC 200 by cutting off external power source voltage EVCC supply to the main IC 200 or by supplying external power source voltage EVCC to the main IC 200. The state of the main IC 200 is either ON or OFF state, and the switching state is either a state in which switching occurs or a state in which switching does not occur. The state in which switching does not occur refers to no-switching.

The main stage 500 according to the first exemplary embodiment of the present invention is a resonant converter including the upper and lower switches M1 and M2 as power switches. The upper and lower switches M1 and M2 are controlled to be alternately turned on and off. Thus, in the first exemplary embodiment of the present invention, if the switching state of one of the upper and lower switches M1 and M2 is recognized, the switching state of the power switch can be recognized. However, the present invention is not meant to be limited to the resonant converter.

The auto-restart circuit 100 includes a state detection unit for detecting the state of the main IC 200 and a switching state detection unit for detecting the switching state of the lower switch M2. The state detection unit for detecting the state of the main IC 200 according to the first exemplary embodiment of the present invention is the feedback signal generating unit 215. The switching state detection unit for detecting the switching state of the lower switch M2 can detect the switching state of the lower switch M2 by using the gate signal LO. The state detection unit for detecting the state of the lower switch M2 is referred to as a switching state detection unit 110. However, the present invention is not meant to be limited thereto, and the switching state of the upper switch M1 may also be detected. In a case of detecting the switching state of the upper switch M1, the auto-restart circuit 100 detects the switching state of the upper switch M1 by using the gate signal HO.

The auto-restart circuit 100 detects the state of the main IC 200 and the switching state of the lower switch M2 upon receiving the gate signal LO and the feedback voltage VFB, and cuts off or supplies the external power source voltage EVCC to control the ON or OFF operation of the main IC 200. The gate signal LO is transferred to the auto-restart circuit 100 via the connection terminal 3.

The auto-restart circuit 100 includes the switching state detection unit 110, a restart controller 120, and a supply switch SW.

The switching state detection unit 110 includes a diode D3, resistors R2 and R3, a capacitor C2, and a control switch SW3.

The diode D3 includes anode and cathode electrodes to which the gate signal LO is inputted. The resistor R3 has one end connected with the cathode electrode of the diode D3 and the other end of which is grounded. The capacitor C2 is connected in parallel with the resistor R3. The control switch SW3 includes a gate electrode connected with the capacitor C2, the resistor R3, and the cathode electrode of the diode D3, a source electrode which is grounded, and a drain electrode connected with a gate electrode of the second control switch SW2. The resistor R2 has one end connected with the drain electrode of the control switch SW3 and the other end to which the power source voltage VCC is inputted.

The gate signal LO alternately has a high level and a low level during a time period in which the lower switch M2 is switched (referred to as a "switching period" hereinafter). When the gate signal LO has the high level, the diode D3 is connected to charge the capacitor C2, and when the gate signal LO has the low level, the diode D3 is blocked (or cut off). Accordingly, a gate signal detection voltage vg3 is maintained at the high level during the switching period of the lower switch M2.

Differently, during a no-switching period of the lower switch M2, the diode D3 is blocked and charges charged in the capacitor C2 are discharged by the resistor R3, so the gate signal detection voltage vg3 has a low level.

When the gate signal detection voltage vg3 has the high level, the control switch SW3 is turned on, and when the gate signal detection voltage vg3 has the low level, the control switch SW3 is turned off. Accordingly, a switching detection voltage vg2 has a low level during the switching period, and the switching detection voltage vg2 has a high level during the no-switching period.

The restart controller 120 includes first and second control switches SW1 and SW2, and a resistor R1. The first control switch SW1 is switched according to the feedback voltage VFB indicating the operation state of the main IC 200. The second control switch SW2 is switched according to the switching detection voltage vg2.

The resistor R1 has one end to which the external power source voltage EVCC is inputted and the other end connected with a gate electrode of the supply switch SW. The first control switch SW1 includes a gate electrode to which the feedback voltage VFB is transferred, a drain electrode connected with the other end of the resistor R1, and a source electrode. The second control switch SW2 includes a gate electrode to which the switching detection voltage vg2 is transferred, a drain electrode connected with the source electrode of the first control switch SW1, and a source electrode which is grounded.

The first control switch SW1 is turned on by a high level feedback voltage VFB and turned off by a low level feedback voltage VFB. The second control switch SW2 is turned on by the high level switching detection voltage vg2 and turned off by the low level switching detection voltage vg2.

When one of the first and second control switches SW1 and SW2 is in an OFF state, the voltage of a node N3 has a high level, and when both the first and second control switches SW1 and SW2 are in an ON state, the voltage of the node N3 has a low level.

When the voltage of the node N3 has a high level, the supply switch SW is turned on to transfer the external power source voltage EVCC to the main IC 200. When the voltage of the node N3 has a low level, the supply switch SW is turned off to cut off the external power source voltage EVCC.

The operation of the auto-restart circuit 100 according to the first exemplary embodiment of the present invention will now be described with reference to FIG. 3. Specifically, the operation of automatically restarting the main IC 200 after a protection state of the auto-restart circuit 100 is terminated will be described.

Figure 3:
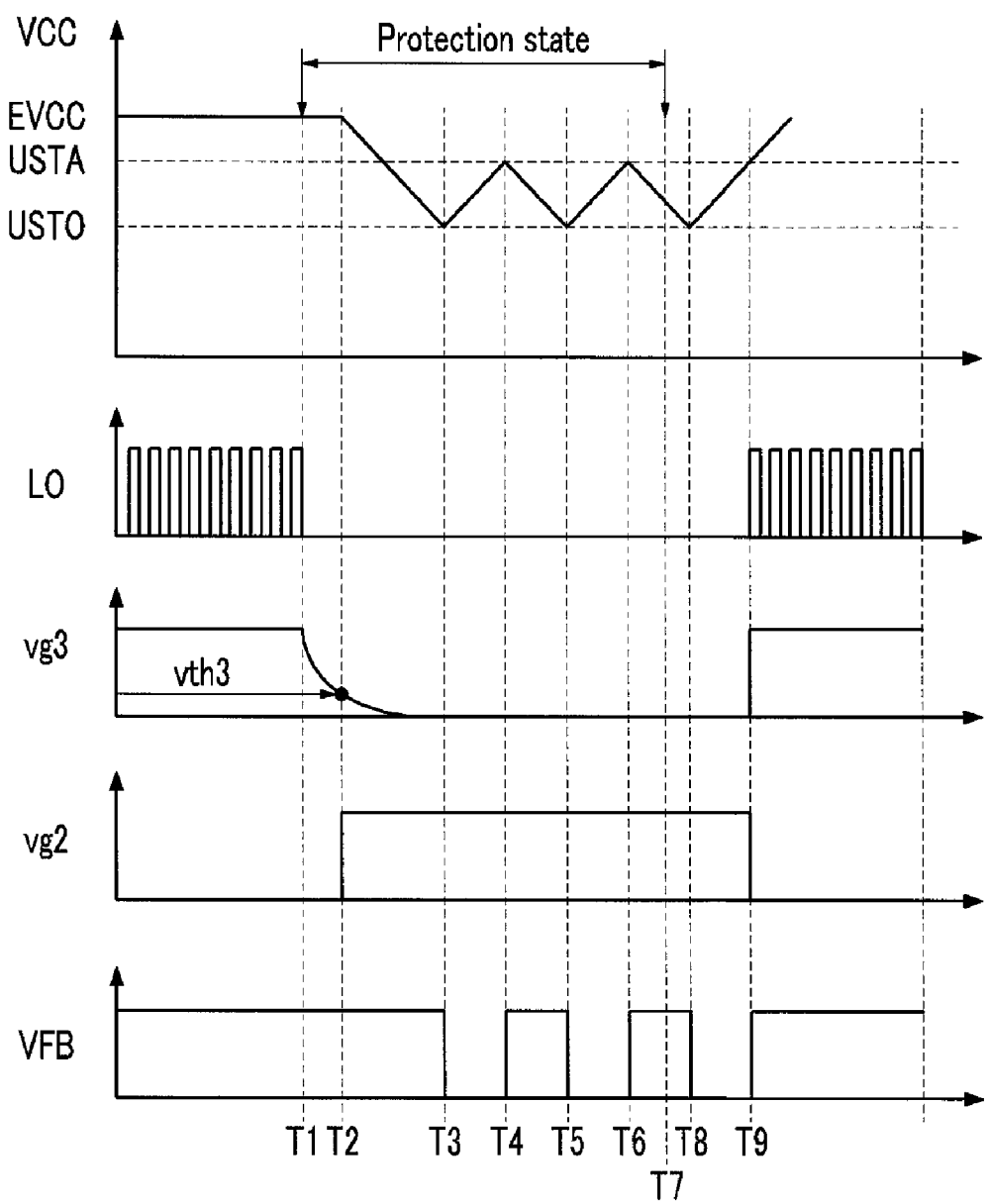
FIG. 3 is a waveform diagram showing a power source voltage, a gate signal, a switching detection voltage, a gate signal detection voltage, and a feedback voltage during a time period in which the main stage is protected and those after the period during which the main stage is protected.

FIG. 3 is a waveform diagram showing a power source voltage, a gate signal, a switching detection voltage, a gate signal detection voltage, and a feedback voltage during a time period in which the main stage is protected and those after the period during which the main stage is protected.

As shown in FIG. 3, a protection state starts from a time point T1. When the protection state starts, the switching operations of the upper and lower switches M1 and M2 are forcibly stopped.

Then, the gate signal LO has a low level at the time point T1, and the low level gate signal LO is maintained until when the main IC 200 is restarted. According to the low level gate signal LO, the diode D3 is blocked and the gate signal detection voltage vg3 starts to be reduced.

When the gate signal detection voltage vg3 is lowered to a threshold voltage vth3 of the control switch SW3 at a time point T2, the control switch SW3 is turned off. Then, the switching detection voltage vg2 has a high level, so the second control switch SW is turned on.

Because the feedback voltage VFB has a high level during the time period in which the main IC 200 is in an ON state, the first control switch SW1 is in an ON state at the time point T2. Thus, because the first and second control switches SW1 and SW2 are all turned on at the time point T2, a low level voltage is applied to the gate electrode of the supply switch SW. Accordingly, the external power source voltage EVCC sent to the main IC 200 is cut off at the time point T2.

Then, the power source voltage VCC inputted via the connection terminal 1 of the main IC 200 decreases from the time point T2. When the decreasing power source voltage VCC reaches the stop voltage USTO at a time point T3, the main IC 200 is turned off and the feedback voltage VFB turns to have a low level. Then, the first control switch SW1 is turned off and a high level voltage is applied to the gate electrode of the supply switch SW. Accordingly, the supply switch SW is turned on to supply the external power source voltage EVCC to the main IC 200, and the power source voltage VCC increases again.

When the increasing power source voltage VCC reaches the start voltage USTA at a time point T4, the main IC 200 is turned on and the feedback voltage VFB has a high level. Because the second control switch SW1 is in the ON state at the time point T4, the supply switch SW is turned off again.

After the time point T4, the power source voltage VCC decrease again, and when the power source voltage VCC reaches the stop voltage TSTO at a time point T5, the main IC 200 is turned off again and the feedback voltage VFB has a low level. Then, the first control switch SW1 is turned off, and a high level voltage is applied to the gate electrode of the supply switch SW. After the time point T5, the supply switch SW is turned on to supply the external power source voltage EVCC to the main IC and the power source voltage VCC increases again.

When the increasing power source voltage VCC reaches the start voltage USTA at a time point T6, the main IC 200 is turned on and the feedback voltage VFB has a high level. Because the second control switch SW1 is in the ON state at the time point T6, the supply switch SW is turned off again.

After the time point T6, the power source voltage VCC decreases again. At a time point T7, the protection state is terminated. When the voltage reaches the stop voltage USTO at a time point T8, the main IC 200 is turned off again and the feedback voltage VFB has a low level. Then, the first control switch SW1 is turned off to apply a high level voltage to the gate electrode of the supply switch SW. After the time point T8, the supply switch SW is turned on to supply the external power source voltage EVCC to the main IC 200, and the power source voltage VCC increases again.

When the power source voltage VCC reaches the start voltage USTA at a time point T9, the main IC is turned on. Because the protection state has been terminated, the main IC 200 switches the upper and lower switches M1 and M2. After the time point T9, the gate signal LO has a high level, so the gate signal detection voltage vg3 has a high level and the switching detection voltage vg2 has a low level. Accordingly, the second control switch SW2 is turned off.

Because the main IC 200 is turned on at the time point T9, the feedback voltage VFB has a high level. Then, the first control switch SW1 is turned on. Because the second control switch SW2 is turned off, a high level voltage is applied to the gate electrode of the supply switch SW to maintain the ON state.

In this manner, the auto-restart circuit 100 according to the first exemplary embodiment of the present invention supplies the external power source voltage EVCC to the main IC 200 or cuts off the supply of the external power source voltage EVCC to the main IC 200 upon detecting the switching state and the state of the main IC 200.

The power source voltage VCC increases, starting from 0, during a start-up period, namely, from a time point when the main stage 500 starts operating to a time point when the output voltage Vout is stabilized. When the power source voltage VCC reaches the start voltage USTA, the main IC 200 is turned on and the feedback VFB starts to increase by the feedback current IFB. The auto-restart circuit 100 repeats supplying the external power source voltage EVCC and cutting it off during the time period in which the feedback voltage VGB increases, so the main stage 500 cannot escape from a burst mode.

When a load connected with the main stage 500 is small, the main stage operates according to the burst mode. The main stage 500 repeats the operation of switching the upper and lower switches M1 and M2 and stopping them according to a burst mode. In general, the start and end of the burst mode are determined according to the feedback voltage VFB. In general, when the feedback voltage VFB is lower than a certain burst voltage BST1, the burst mode starts, and when the feedback voltage is higher than the certain burst stop voltage BSTO, the burst mode is terminated. In this case, the burst start voltage BST1 is lower than the burst stop voltage BSTO.

Figure 4:
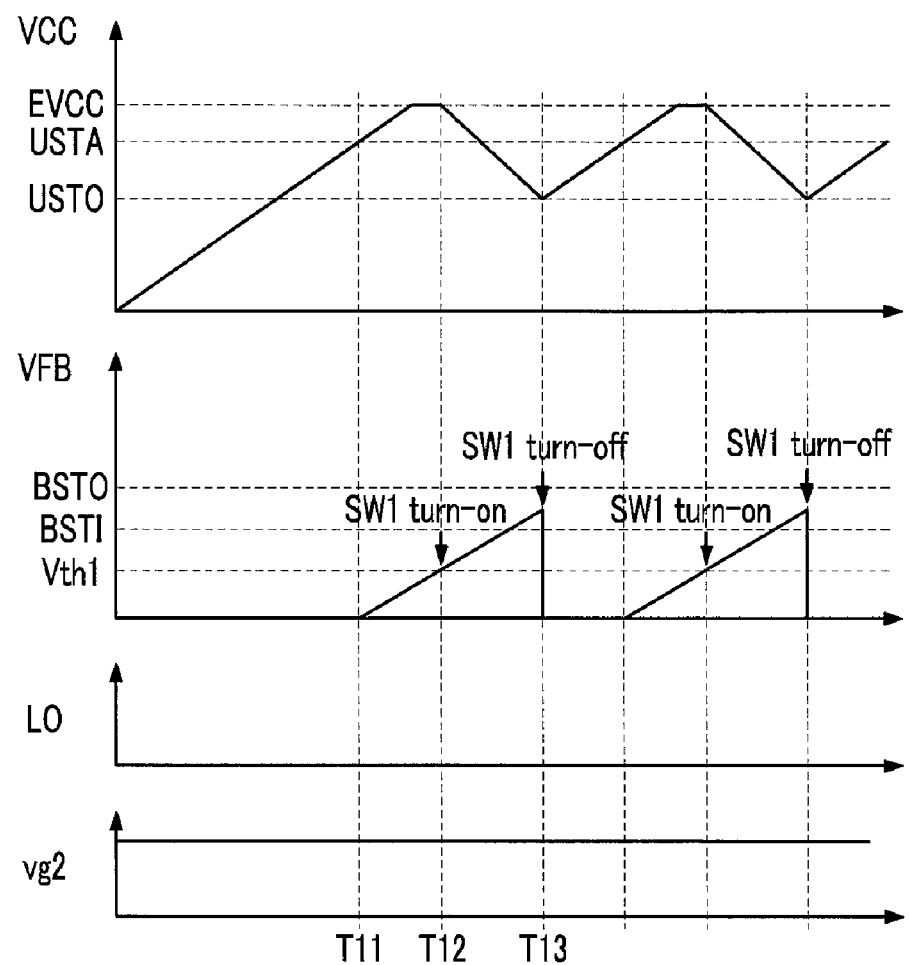
FIG. 4 is a waveform diagram illustrating malfunction that may occur when a threshold voltage of a first control switch is lower than a burst stop voltage.

FIG. 4 is a waveform diagram illustrating malfunction that may occur when a threshold voltage of a first control switch is higher than a burst stop voltage.

When the power source voltage VCC reaches the start voltage USTA at a time point T11, the feedback voltage VFB starts to be increased. When the feedback voltage VFB increases to a threshold voltage vth1 of the first control switch SW1 at a time point T12, the first control switch SW1 is turned on. At this time, the upper and lower switches M1 and M2 do not perform a switching operation, the gate signal LO has a low level and the switching detection voltage vg2 has a high level. Accordingly, the gate voltage of the second control switch SW2 is maintained at the high level.

Because the first and second control switches SW1 and SW2 are turned on at the time point T12, the supply switch SW is turned off to cut off the external power source voltage EVCC. Accordingly, the power source voltage VCC starts to decrease at the time point T12. When the power source voltage VCC decreases to the stop voltage USTO at a time point T13, the main IC 200 is turned off and the feedback voltage VFB is dropped to have a low level.

Because the feedback voltage VFB is smaller than the burst stop voltage BSTO, the main stage 500 operates in the burst mode.

Because the feedback voltage VFB has a low level at the time point T13, the first control switch SW1 is turned off and the supply switch SW is turned on to increase the power source voltage VCC again.

The following processes are repetitions of the above-described time periods T11 to T13. If such malfunction occurs, the main stage 500 cannot escape from the burst mode.

An auto-restart circuit 100' according to a second exemplary embodiment of the present invention further includes an element for preventing the main stage 500 from operating in the burst mode during a start-up period.

Figure 5:
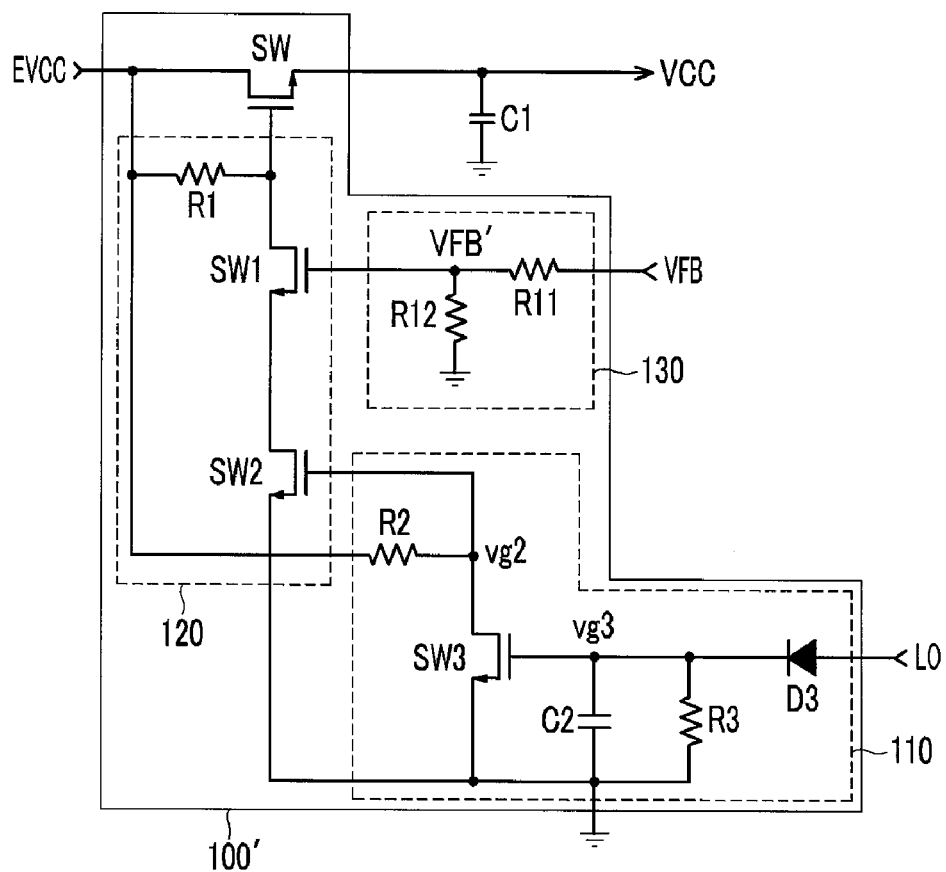
FIG. 5 is a drawing illustrating an auto-restart circuit according to a second exemplary embodiment of the present invention.

FIG. 5 is a drawing illustrating the auto-restart circuit 100' according to the second exemplary embodiment of the present invention. The auto-restart circuit 100' further includes a threshold voltage compensation unit 130 compared with the first exemplary embodiment of the present invention as described above. The other configurations of the auto-restart circuit 100' according to the second exemplary embodiment of the present invention are the same as those of the auto-restart circuit 100 according to the first exemplary embodiment of the present invention, so its description will be omitted.

The threshold voltage compensation unit 130 lowers the feedback voltage VFB at a certain rate and transfers a first compensation feedback voltage VFB' to the gate electrode of the first control switch SW1. When the feedback voltage VFB is higher than the burst stop voltage BSTO, the threshold voltage compensation unit 130 distributes the feedback voltage VFB to generate the first compensation feedback voltage VFB' and transfers the first compensation feedback voltage VFB' to the gate electrode of the first control switch SW1 so that the first control switch SW1 can be turned on.

The threshold voltage compensation unit 130 includes resistors R11 and R12. The resistor R11 has one end to which the feedback voltage VFB is inputted and the other end connected with the gate electrode of the first control switch SW1. The resistor R12 has one end connected with the other end of the resistor R11 and the other end which is grounded.

Accordingly, the voltage inputted to the gate electrode of the first control switch SW1 is VFB*(R12/(R11+R12)). In other words, when the feedback voltage VFB reaches a voltage (vth1*(R11+R12)/R12), the first compensation feedback voltage VFB' reaches a threshold voltage of the first control switch SW1 to turn on the first control switch SW1.

Figure 6:
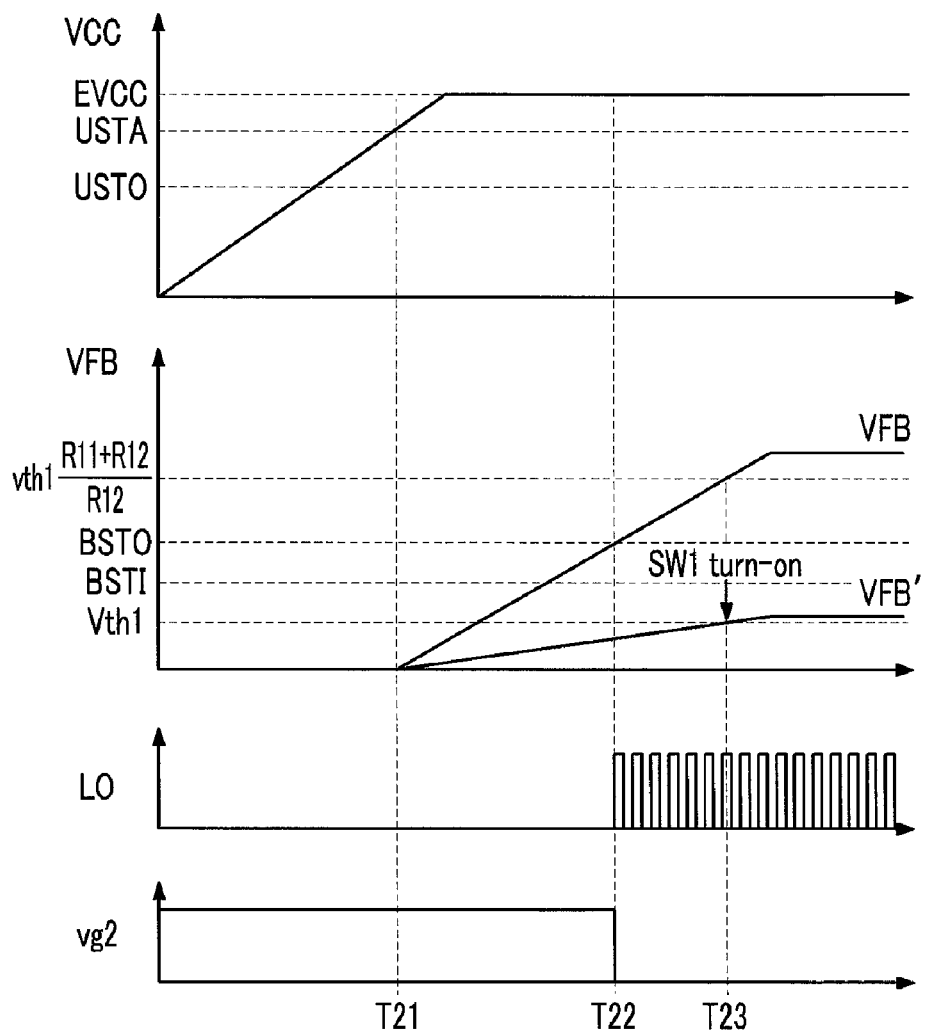
FIG. 6 is a waveform diagram for explaining the operation of the auto-restart circuit according to the second exemplary embodiment of the present invention.

FIG. 6 is a waveform diagram for explaining the operation of the auto-restart circuit 100' according to the second exemplary embodiment of the present invention.

As shown in FIG. 6, as the power source voltage VCC reaches the start voltage USTA at a time point T21, the main IC 200 is turned on and the feedback voltage VFB starts to increase.

The upper and lower switches M1 and M2 begin switching at a time point T22 when the feedback voltage VFB reaches the burst stop voltage BSTO. Namely, the gate signal LO is generated starting from the time point T22, so the switching detection voltage vg2 has a low level and the second control switch SW2 is turned off.

The feedback voltage VFB reaches the compensated threshold voltage (vth1*(R11+R12)/R12) at a time point T23, and the first control switch SW1 is turned on by the first compensation threshold voltage VFB'. Because the second control switch SW2 is in an OFF state, the supply switch SW is maintained in the ON state. Accordingly, the external power source voltage EVCC is supplied to the main IC 200 without any interval where the upper and lower switches M1 and M2 are turned off.

In this manner, the auto-restart circuit 100' according to the second exemplary embodiment of the present invention can prevent a burst mode malfunction.

During the start-up time period, the upper and lower switches M1 and M2 may start switching with a certain time period delay starting from a time point when the main IC 200 is turned on. In this case, however, malfunction may occur that the external power source voltage EVCC is cut off during the delay time period.

Figure 7:
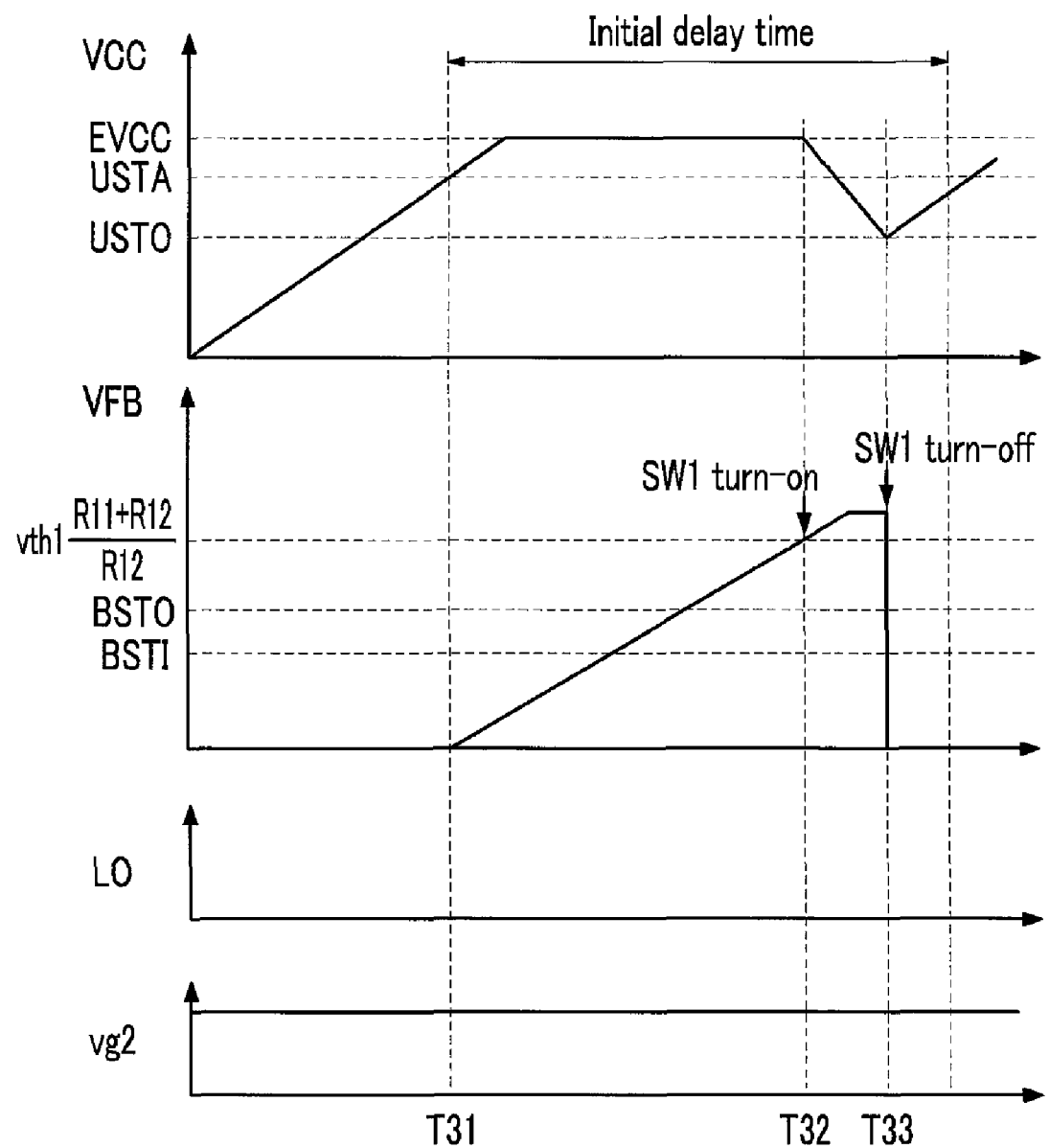
FIG. 7 is a waveform diagram for explaining malfunction that may occur when there is a delay between a turn-on time point of a main integrated circuit (IC) and a time point at which switching starts.

FIG. 7 is a waveform diagram for explaining malfunction that may occur when there is delay between a turn-on time point of a main integrated circuit (IC) and a time point at which switching starts. The delay time between the turn-on time point of the main IC 200 and the switching start time point during the start-up period will be referred to as an "initial delay time".

As shown in FIG. 7, when the power source voltage VCC reaches the start voltage USTA at a time point T31, the main IC 200 is turned on and the feedback voltage VFB starts to increase. When the feedback voltage VFG reaches the compensated threshold voltage (vth1*(R11+R12)/R12), the first control switch is turned on. At this time, because the control switch SW2 is in the ON state, the supply switch SW is turned off.

Starting from a time point T33, the power source voltage VCC decreases and the power source voltage VCC reaches the stop voltage USTO. At a time point T33, the main IC 200 is turned off and the feedback voltage VFB has a low level to turn off the first control switch SW1. Then, the supply switch SW is turned on to increase the power source voltage VCC starting from the time point T33.

When the increasing power source voltage VCC reaches the start voltage USTA, the main IC 200 is turned on and the feedback voltage VFB starts to increase.

The following operations are the same as those during the time periods T31 to T33.

In this case, a problem may arise in that, with such an initial delay time, although the main IC 200 is turned on, switching does not start.

In order to solve the problem, an auto-restart circuit 100" according to a third exemplary embodiment of the present invention adjusts a rising tilt of the feedback voltage VFB.

Figure 8:
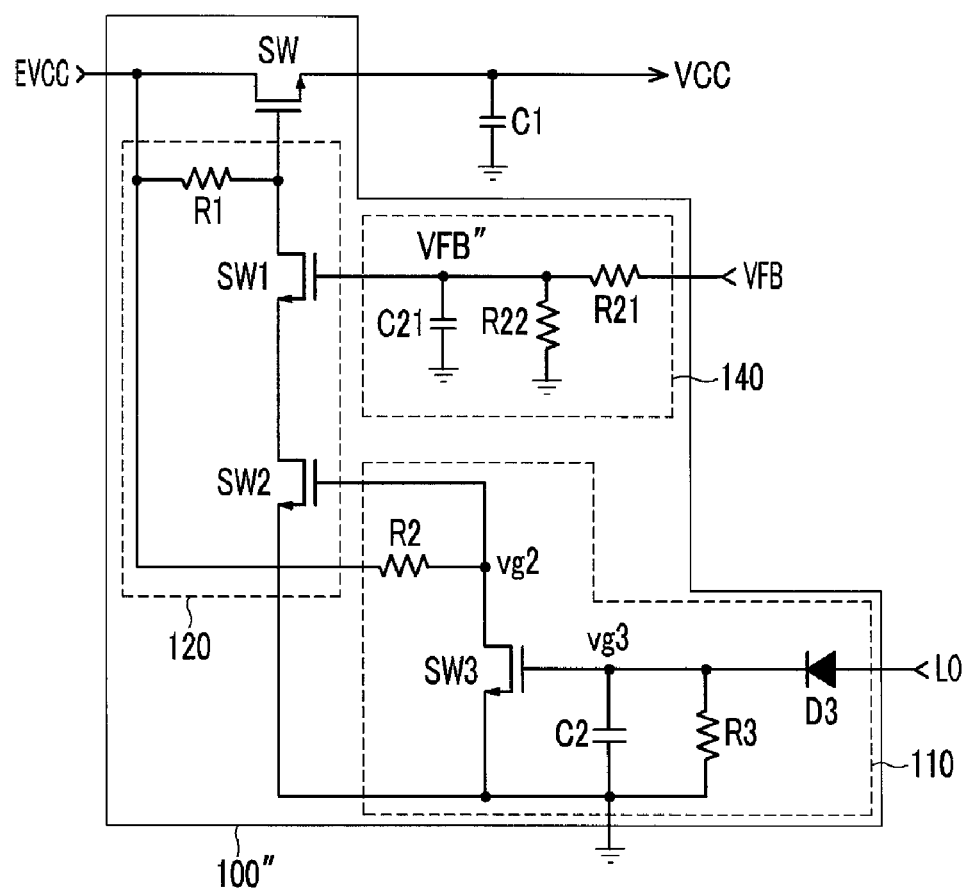
FIG. 8 is a drawing illustrating an auto-restart circuit according to a third exemplary embodiment of the present invention.

FIG. 8 is a drawing illustrating the auto-restart circuit 100" according to a third exemplary embodiment of the present invention. A threshold voltage compensation unit 140 of the auto-restart circuit 100" according to the third exemplary embodiment of the present invention additionally includes a capacitor C21 compared with the threshold voltage compensation unit 130 of the auto-restart circuit 100' according to the second exemplary embodiment of the present invention. The other elements of the auto-restart circuit 100" according to the third exemplary embodiment of the present invention are the same as those of the auto-restart circuit 100' according to the second exemplary embodiment of the present invention, so its description will be omitted.

The threshold voltage compensation unit 140 generates a second compensation feedback voltage VFB" by lowering the size and a rising tilt of the feedback voltage VFB, and transfers the generated second compensation feedback voltage VFB" to the first control switch SW1. The threshold voltage compensation unit 140 power-divides the size of the feedback voltage VFB such that it can turn on the first control switch SW1, generates a second compensation feedback voltage VFB" by lowering the rising tilt of the feedback voltage VFB by using the capacitor, and transfers the second compensation feedback voltage VFB" to the gate electrode of the first control switch SW1.

The threshold voltage compensation unit 140 includes a capacitor C21 and the resistors R21 and R22. The resistor R21 has one end to which the feedback voltage VFB is inputted and the other end connected with the gate electrode of the first control switch SW1. The resistor R22 has one end connected with the other end of the resistor R21 and the other end which is grounded. The capacitor 21 has one end connected with the other end of the resistor R21 and the other end which is grounded.

Accordingly, the voltage inputted to the gate electrode of the first control switch SW1 is VFB*(R21/(R21+R22)), and the rising tilt of the voltage is lowered by the capacity of the capacitor 21 compared with the second exemplary embodiment of the present invention. Namely, the time during which the voltage inputted to the gate electrode of the first control switch SW1 reaches the threshold voltage vth1 of the first control switch SW1 is delayed, and the first control switch SW1 is turned on after the initial delay time period.

Figure 9:
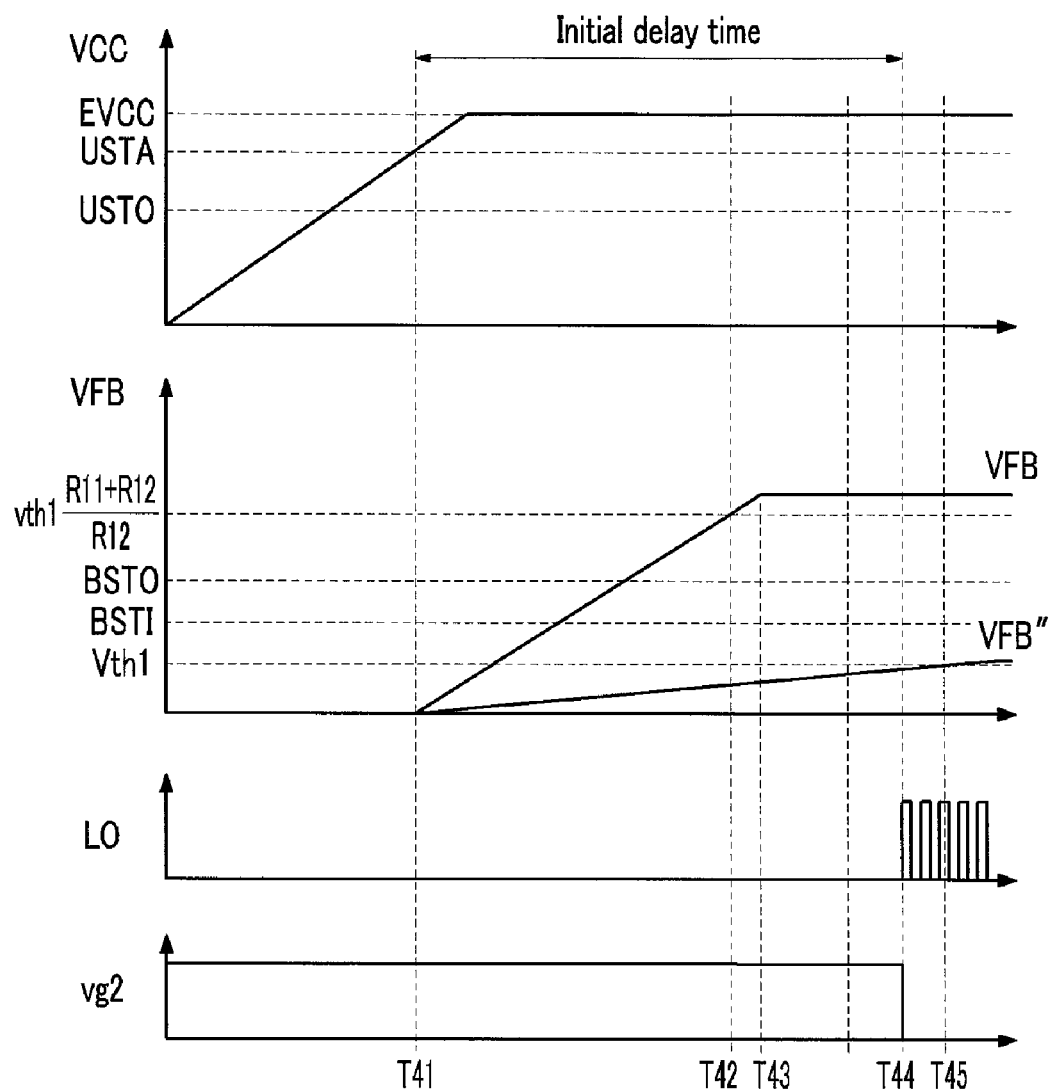
FIG. 9 is a waveform diagram for explaining the operation of the auto-restart circuit according to the third exemplary embodiment of the present invention.

As shown in FIG. 9, the feedback voltage VFB reaches the voltage (vth1\*(R21+R22)/R22) at a time point T42 and is then stabilized after a time point T43, while the second compensation feedback voltage VFB" reaches the threshold voltage vth1 of the first switch SW1 at a time point T45. At this time, the first switch SW1 is turned on.

Thus, the time taken for the second compensation feedback voltage VFB" to increase to the threshold voltage vth1 is longer compared with the second exemplary embodiment of the present invention. Thus, the turn-on time point of the first control switch SW1 can be deferred to a point after the initial delay time.

FIG. 9 is a waveform diagram for explaining the operation of the auto-restart circuit 100" according to the third exemplary embodiment of the present invention.

As shown in FIG. 9, as the power source voltage VCC reaches the start voltage USTA at a time point T41, the main IC 200 is turned on and the feedback voltage VFB starts to increase.

The gate signal LO is generated at a time point T42 that has been delayed by the initial delay time period from the time point T41, and the switching detection voltage vg2 has a low level. Then, the second control switch SW2 is turned off.

The feedback voltage VFB reaches the compensated threshold voltage (vth1\*(R21+R22)/R22) at a time point T43, and the first control switch SW1 is turned on by the second compensation threshold voltage VFB". Because the second control switch SW2 is in an OFF state, the supply switch SW is maintained in the ON state. Accordingly, the external power source voltage EVCC is supplied to the main IC 200 without any interval where the upper and lower switches M1 and M2 are turned off.

In this manner, the auto-restart circuit 100" according to the third exemplary embodiment of the present invention can prevent malfunction due to the initial delay time.

Thus far, in the first to third exemplary embodiments of the present invention, the feedback signal generating unit 215 is used as the means for detecting the operation state of the main IC 200. The auto-restart circuits 100, 100', and 100" according to the first to third exemplary embodiments of the present invention can detect ON or OFF of the main IC 200 by using the feedback voltage VFB.

In the following exemplary embodiment, an operation state of a main IC 200' is detected by using a reference voltage, which is generated as the main IC 200' is turned on, instead of using the feedback voltage VFB.

Figure 10:
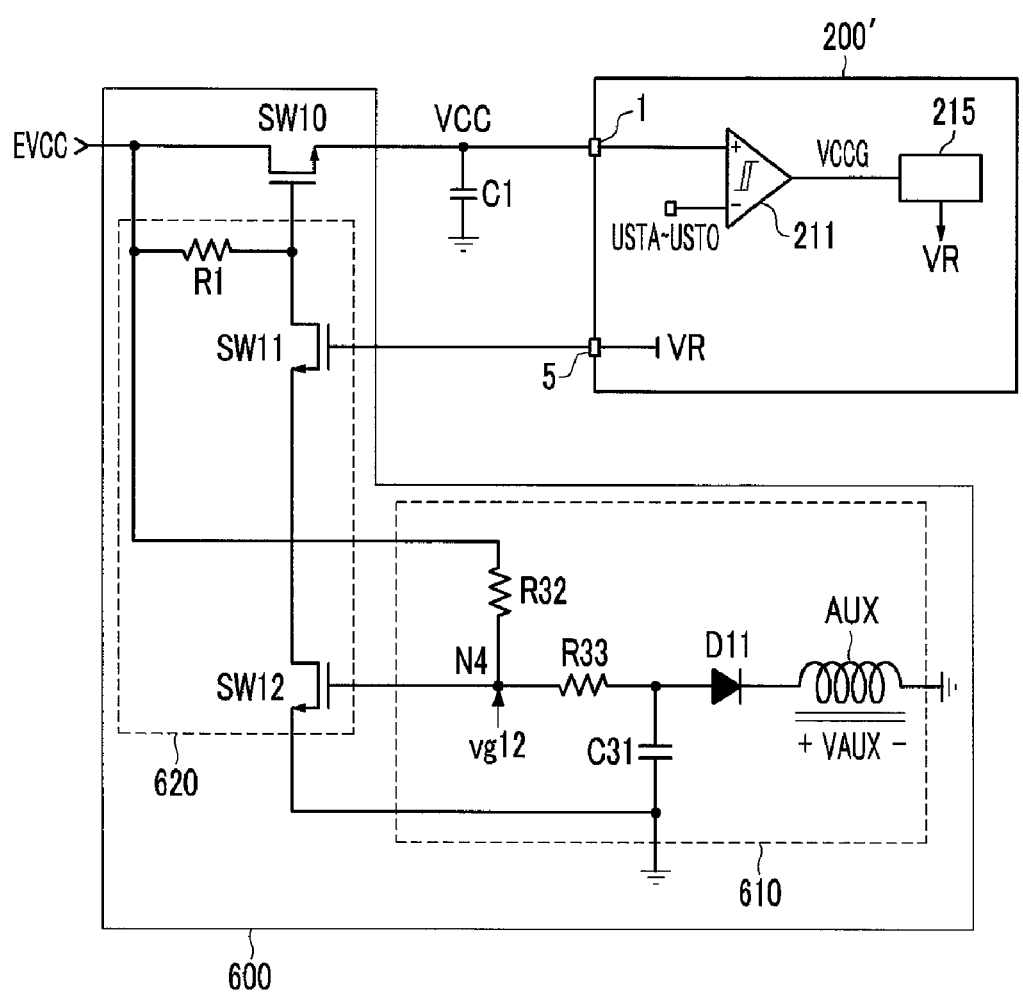
FIG. 10 is a drawing illustrating a main IC according to a fourth exemplary embodiment of the present invention.

FIG. 10 is a drawing illustrating the main IC 200' according to a fourth exemplary embodiment of the present invention.

As shown in FIG. 10, when the power source voltage VCC reaches the start voltage USTA, a reference voltage generator 215 generates a reference voltage VR and supplies the generated reference voltage VR to an auto-restart circuit 600. The reference voltage VR may be one of reference voltages required for the operation of the main IC 200'. Also, the reference voltage generator 215 may generate the reference voltage VR in order to inform that the main IC 200' is in an ON state.

The auto-restart circuit 600 includes a switching state detection unit 610, a restart controller 620, and a supply switch SW10.

The restart controller 620 includes a first control switch SW11, a second control switch SW12, and a resistor R31. The connection relationship among the first and second control switches SW11 and SW12 and the resistor R31 is the same as that in the former exemplary embodiment, so its description will be omitted. When one of the first and second control switches SW11 and SW12 is turned off, the supply switch SW10 is turned on, and when both the first and second control switches SW11 and SW12 are turned on, the supply switch SW10 is turned off.

The switching state detection unit 610 includes an auxiliary coil AUX coupled to the primary coil Co1 at a certain winding ratio, a diode D11, resistors R32 and R33, and a capacitor C31. The auxiliary coil (AUX) has one end which is grounded and the other end connected with a cathode electrode of the diode D11. An anode electrode of the diode D11 is connected with one end of the resistor R33 and one end of the capacitor C31. The other end of the capacitor C31 is grounded, and the other end of the resistor R33 is connected with one end of the resistor R32 and a gate electrode of the second control switch SW12. The external power source voltage EVCC is applied to the other end of the resistor R32.

When the upper and lower switches M1 and M2 begin switching, a both-end voltage of the primary coil Co1 begins to be generated by resonance. The both-end voltage of the primary coil Co1 alternately has positive and negative voltages. Thus, the both-end voltage VAUX of the auxiliary coil (AUX) alternately has negative and positive voltages. The both-end voltage VAUX of the auxiliary coil AUX will be referred to as an "auxiliary voltage (VAUX)", hereinafter. The auto-restart circuit 600 according to the fourth exemplary embodiment of the present invention can detect a switching state by using the auxiliary voltage VAUX.

When the auxiliary voltage VAUX is a negative voltage, the diode D11 is connected and the anode voltage of the diode D11 is a negative voltage. Then, one end of the capacitor C31 has a negative voltage, and the difference between the external power source voltage EVCC and the voltage at one end of the capacitor C31 is distributed according to a resistance ratio of the resistors R32 and R33. In this case, the resistors R32 and R33 are set such that a node N4 to which the resistors R33 and R33 are connected has a negative voltage. The voltage at the node N4 is a switching detection voltage vg12 that controls switching of the second control switch SW12. When the auxiliary voltage VAUX is a positive voltage, the diode D11 is blocked and one end of the capacitor C31 is maintained as a negative voltage.

After the upper and lower switches M1 and M2 begin switching, the switching detection voltage vg12 becomes a negative voltage by the auxiliary voltage VAUX and the second control switch SW2 is turned off.

When the upper and lower switches M1 and M2 are in a no-switching state, the auxiliary voltage VAUX is not generated. A cathode voltage of the diode D11 is a ground voltage, the voltage at one end of the capacitor C31 increases from a negative voltage so as to become a ground voltage. The difference between the external power source voltage EVCC and the voltage at one end of the capacitor C31 is distributed at the resistance ratio of the resistors R32 and R33. During a time period in which the voltage at one end of the capacitor C31 increases from the negative voltage to the ground voltage, the switching detection voltage vg12 increases. When the voltage at one end of the capacitor C31 becomes the ground voltage, the switching detection voltage vg12 has such a high level so as to turn on the second control switch SW12.

The reference voltage VR is transferred to the gate electrode of the first control switch SW11 via a connection terminal 5, and it has such a high level so as to turn on the first control switch SW11.

The operation of the auto-restart circuit 600 according to the fourth exemplary embodiment of the present invention will now be described with reference to FIG. 11.

Figure 11:
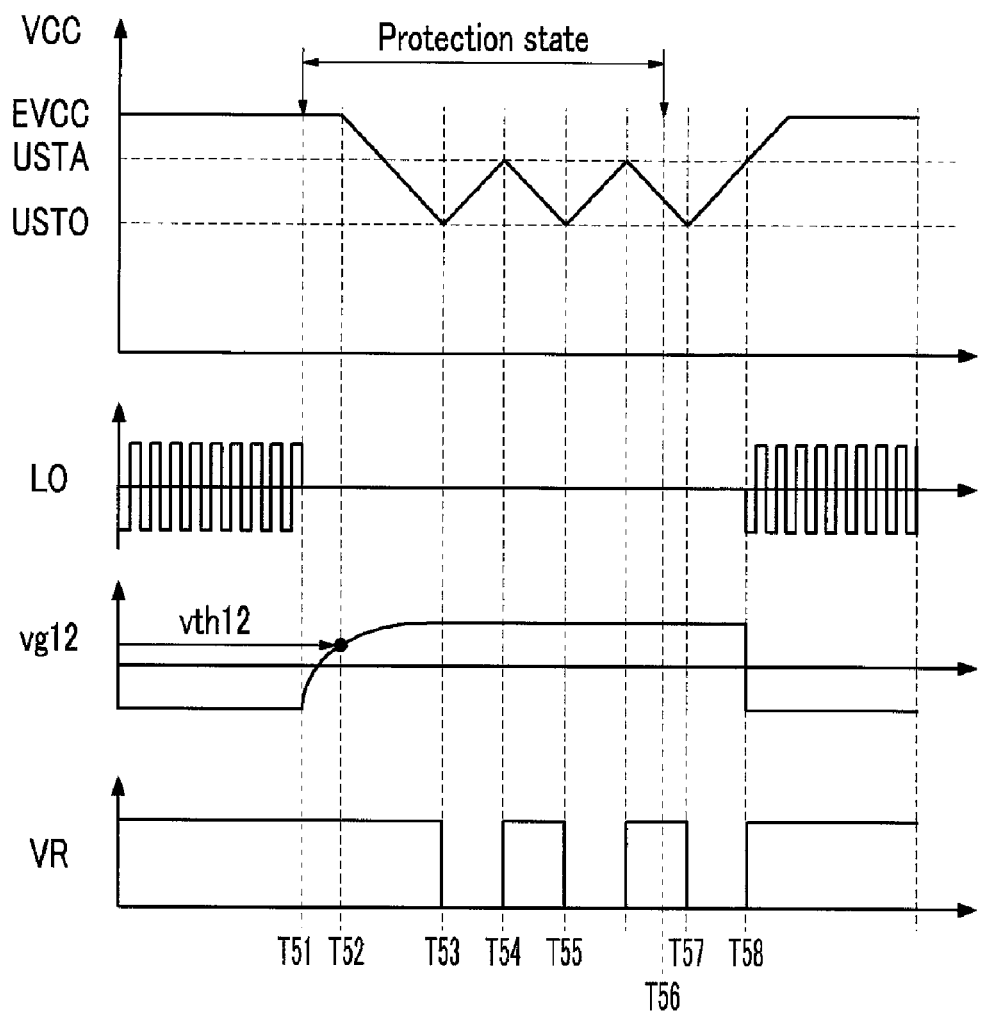
FIG. 11 is a waveform diagram for explaining the operation of the auto-restart circuit according to the fourth exemplary embodiment of the present invention.

FIG. 11 is a waveform diagram for explaining the operation of the auto-restart circuit 600 according to the fourth exemplary embodiment of the present invention.

Before a time point T51 at which a protection state starts, the upper and lower switches M1 and M2 are switched, so the auxiliary voltage VAUX alternately has positive and negative voltages. Accordingly, the switching detection voltage vg12 is uniformly maintained as a negative voltage. Also, because the main IC 200' is in the ON state, the reference voltage VR is maintained at the high level.

Before the time point T51, the first control switch SW11 is turned on and the second control switch SW12 is turned off, so the supply switch SW10 is turned on. Accordingly, the external power source voltage EVCC is supplied to the main IC 200'. When the protection state starts at the time point T51, the upper and lower switches M1 and M2 turn to a non-switching state. Then, the switching detection voltage vg12 starts to increase from the time point T51.

When the switching detection voltage vg12 reaches the threshold value vth12 of the second control switch SW12 at a time point T52, the second control switch SW12 is turned on. Because the first and second control switches SW11 and SW12 are in the ON state starting from the time point T52, the supply switch SW10 is turned off. Then, the external power source voltage EVCC is cut off, so the power source voltage VCC starts to decrease.

When the power source voltage VCC reaches to stop voltage USTO at a time point T53, the main IC 200' is turned off and the reference voltage VR has a low level. Accordingly, the first control switch SW11 is turned off and the supply switch SW10 is turned on.

The external power source voltage EVCC is supplied, starting from the time point T53, to the main IC 200', so the power source voltage VCC starts to increase again.

When the power source voltage VCC reaches the start voltage USTA at a time point T54, the main IC 200' is turned on and the reference voltage VR has a high level. Then, the first control switch SW11 is turned on and the supply switch SW10 is turned off.

The power source voltage VCC decreases after the time point T54, and when the power source voltage VCC reaches the stop voltage USTO at a time point T55, the main IC 200' is turned off and the reference voltage VR has a low level. Then, the first control switch SW11 is turned off and the supply switch SW10 is turned on.

After a time point T55, the operation from the time point T53 to the time point T55 is repeated.

The protection state is terminated at a time point T56 and the power source voltage VCC turns to the stop voltage USTO at a time point T57, and accordingly, the main IC 200' is turned off and the reference voltage VR has a low level. Because the first control switch SW11 is turned off and the supply switch SW10 is turned on at the time point T57, the power source voltage VCC increases from the time point T57, and when the power source voltage VCC reaches the start voltage USTA at a time point T58, the main IC 200' is turned on and the reference voltage VR has a high level. The first control switch SW11 is turned on.

Because the upper and lower switches M1 and M2 begin switching from the time point T58, the auxiliary voltage VAUX is generated. When the switching detection voltage vg12 is changed to a negative voltage due to the auxiliary voltage VAUX, the second control switch SW12 is turned off.

Accordingly, the supply switch SW10 is turned on at the time point T58 and maintained in the ON state since then, and the power source voltage VCC increases to the external power source voltage EVCC.

In this manner, the auto-restart circuit 600 according to the fourth exemplary embodiment of the present invention detects the switching state by using the auxiliary voltage VAUX and detects the state of the main IC 200' by using the reference voltage VR.

The configuration for preventing malfunction due to the initial delay time in the third exemplary embodiment of the present invention may also be applied for the fourth exemplary embodiment of the present invention.

Figure 12:
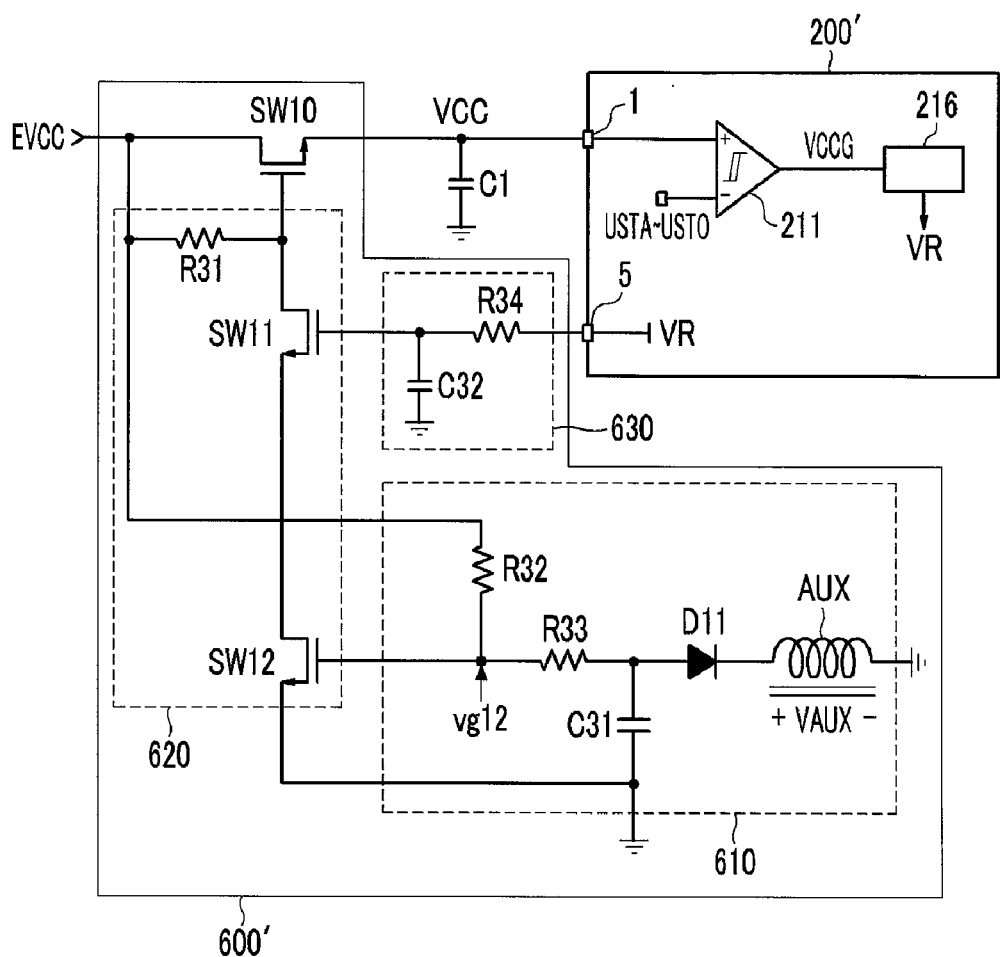
FIG. 12 is a drawing illustrating an auto-restart circuit according to a fifth exemplary embodiment of the present invention.

FIG. 12 is a drawing illustrating an auto-restart circuit according to a fifth exemplary embodiment of the present invention. Compared with the fourth exemplary embodiment of the present invention, an auto-restart circuit 600' additionally includes a threshold voltage compensation unit 630 for turning on the first control switch SW11 after the initial delay time.

The threshold voltage compensation unit 630 includes a resistor R34 and a capacitor C32.

During the start-up period, the reference voltage increases, and the voltage inputted to the gate electrode of the first control switch SW11 increases gently according to the time constant increased by the capacitor C32 and the resistor R34. In this case, the capacitor C32 and the resistor R34 are set appropriately such that the first control switch SW11 is not turned on during the initial delay time after the main IC 200' is turned on.

Thus, malfunction due to such initial delay time as described in the third exemplary embodiment of the present invention can be prevented.

Thus far, the first to fifth exemplary embodiments of the present invention have been described. The auto-restart circuit according to the exemplary embodiments of the present invention supplies the external power source voltage or cuts it off by detecting the state of the main IC and the switching state. The auto-restart circuit can prevent malfunction that may be caused due to the burst mode or the initial delay time during the start-up period.

The foregoing embodiments and advantages are merely exemplary and are not to be construed as limiting the present invention. As the exemplary embodiments may be implemented in several forms without departing from the characteristics thereof, it should also be understood that the above-described embodiments are not limited by any of the details of the foregoing description. It should also be understood that the present invention is meant to cover all modifications, similarities, and alternatives that are included in the spirit and scope of the present invention. Therefore, various changes and modifications that fall within the scope of the claims, or equivalents of such scope, are therefore intended to be embraced by the appended claims.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An auto-restart circuit for restarting at least one power switch and a main integrated circuit (IC) that controls a switching operation of the at least one power switch, the circuit comprising:
   a switching state detection unit configured to detect a switching state of the at least one power switch;
   a state detection unit configured to detect a state of the main IC; and
   a restart controller coupled to receive a signal from the switching state detection unit indicative of the switching state of the at least one power switch and coupled to receive another signal from the state detection unit indicative of the state of the main IC, the restart controller having an output configured to cut off or supply an external power source voltage supply to a power supply connection terminal of the main IC according to the switching state of the at least one power switch and the state of the main IC, the external power source voltage supply and the restart controller being external to the main IC.

2. The circuit of claim 1, wherein when the at least one power switch is in a no-switching state and the main IC is in an ON state by receiving the external power source voltage supply, the restart controller circuit is configured to cut off the external power source voltage supply from the main IC and thereby put the main IC in an OFF state.

3. The circuit of claim 1, wherein when the at least one power switch is in a switching state or when the main IC is in an OFF state by not receiving the external power source voltage supply, the restart controller circuit is configured to supply the external power source voltage supply to the main IC and thereby put the main IC in an ON state.

4. The circuit of claim 1, further comprising:
   a supply switch configured to transfer the external power source voltage supply to the main IC, the supply switch being external to the main IC and coupled to the power supply connection terminal of the main IC; and
   the restart controller being configured to control switching of the supply switch,
   wherein the switching state detection unit generates a switching detection voltage according to a gate signal for controlling switching of the at least one power switch, and the state detection unit for detecting the state of the main IC is a feedback signal generating unit that generates a feedback voltage by a feedback current generated when the main IC is in an ON state by receiving the external power source voltage supply.

5. The circuit of claim 4, wherein the restart controller comprises:
   a first control switch having one end connected with a gate electrode of the supply switch;
   a second control switch having one end connected with the other end of the first control switch; and
   a resistor having one end connected with the one end of the first control switch and the other end to which the external power source voltage supply is applied, wherein the first control switch performs a switching operation according to the feedback voltage and the second control switch performs a switching operation according to the switching detection voltage.

6. The circuit of claim 5, wherein the feedback voltage is generated when the main IC is in the ON state, and is not generated when the main IC is in an OFF state by not receiving the external power source voltage supply.

7. The circuit of claim 6, wherein the feedback signal generating unit comprises:
   an opto-diode configured to generate light with strength corresponding to an output voltage generated according to the switching operation of the power switch;
   an opto-transistor configured to form an opto-coupler with the opto-diode; and a feedback capacitor having one end connected with one end of the opto-transistor and the other end which is grounded,
   wherein the feedback current is supplied to the opto-transistor and the feedback capacitor, and a gate electrode of the first switch is connected with the one end of the feedback capacitor.

8. The circuit of claim 5, wherein the switching state detection unit comprises:
   a diode having an anode electrode to which the gate signal is inputted;
   a first resistor having one end connected with a cathode electrode of the diode and the other end which is grounded;
   a capacitor having one end connected with the one end of the first resistor and the other end which is grounded;
   a switch having a gate electrode connected with the one end of the capacitor and a first electrode which is grounded; and a second resistor having one end connected with a second electrode of the switch and the other end to which the external power source voltage is supplied, wherein the voltage of the one end of the second resistor is a switching detection signal.

9. The circuit of claim 5, further comprising:

a threshold voltage compensation unit configured to compensate for the level of the feedback voltage and transfer the level-compensated feedback voltage to the gate electrode of the first control switch so that the first control switch can be turned on when the feedback voltage is higher than a certain burst stop voltage.

10. The circuit of claim 9, wherein the threshold voltage compensation unit comprises:

a first resistor having one end connected with the gate electrode of the first control switch and the other end which is grounded; and a second resistor having one end connected with the one end of the first resistor and the other end to which the feedback voltage is inputted.

11. The circuit of claim 9, wherein when there is an initial delay time between a turn-on time point of the main IC and a switching time point of the at least one power switch, the threshold voltage compensation unit compensates for the feedback voltage such that the feedback voltage has such a level so as to turn on the first control switch after the initial delay time, and transfers the compensated feedback voltage to the gate electrode of the first control switch.

12. The circuit of claim 11, wherein the threshold voltage compensation unit comprises:

a first resistor having one end connected with the gate electrode of the first control switch and the other end which is grounded;

a second resistor having one end connected with the one end of the first resistor and the other end to which the feedback voltage is inputted; and a capacitor connected in parallel with the first resistor.

13. The circuit of claim 1, further comprising:

a supply switch configured to transfer the external power source voltage to the main IC; and a restart controller configured to control switching of the supply switch, wherein the switching state detection unit comprises an auxiliary coil coupled at a certain winding ratio to a primary coil that generates voltage according to switching of the at least one power switch and generates the switching detection voltage by using an auxiliary voltage of the auxiliary coil, and the state detection unit for detecting the state of the main IC uses a reference voltage generated when the main IC is in the ON state.

14. The circuit of claim 13, wherein the re-start controller comprises:

a first control switch having one end connected with the gate electrode of the supply switch;

a second control switch having one end connected with the other end of the first control switch; and a resistor having one end connected with the one end of the first control switch and the other end to which the external power source voltage is applied, wherein the first control switch performs a switching operation according to the reference voltage and the second control switch performs a switching operation according to the switching detection voltage.

15. The circuit of claim 14, wherein the switching state detection unit comprises:

a diode having a cathode electrode connected with one end of the auxiliary coil;

a capacitor having one end connected with an anode electrode of the diode and the other end which is grounded;

a first resistor having one end connected with the one end of the capacitor and the other end connected with a control electrode of the second control switch; and a second resistor having one end connected with the control electrode of the second control switch and the other end to which the external power source voltage is applied.

16. The circuit of claim 14, further comprising:

a threshold voltage compensation unit configured to compensate for the reference voltage such that the reference voltage has such a level so as to turn on the first control switch after an initial delay time and transfer the compensated reference voltage to the gate electrode of the first control switch, when the initial delay time comes between a turn-on time point of the main IC and a switching time point of the at least one power switch.

17. The circuit of claim 16, wherein the threshold voltage compensation unit comprises:

a resistor having one end to which the reference voltage is applied and the other end connected with the gate electrode of the first control switch; and a capacitor having one end connected with the gate electrode of the first control switch and the other end which is grounded.

18. An auto-restart method for restarting at least one power switch and a main integrated circuit (IC) that controls a switching operation of the at least one power switch, the method comprising:

the main IC controlling switching operation of the at least one power switch;

detecting a switching state of the at least one power switch;

detecting a state of the main IC; and cutting off an external power source voltage supply to a power supply connection terminal of the main IC or supplying the external power source voltage to the power supply connection terminal of the main IC according to the switching state and the state of the main IC, the external power source voltage supply being external to the main IC.

19. The method of claim 18, wherein the cutting off or supplying of the external power source voltage to the main IC comprises, when the at least one power switch is in a no-switching state and the main IC is in an ON state by receiving the external power source voltage supply, cutting off the external power source voltage from the main IC.

20. The method of claim 18, wherein the cutting off or supplying of the external power source voltage to the main IC comprises, when the at least one power switch is in a switching state or when the main IC is in an OFF state by not receiving the external power source voltage supply, supplying the external power source voltage to the main IC.

* * * * *